(12) United States Patent
Baek et al.

(10) Patent No.: US 11,843,076 B2
(45) Date of Patent: Dec. 12, 2023

(54) SINGLE CHIP MULTI BAND LED AND APPLICATION THEREOF

(71) Applicant: SEOUL VIOSYS CO., LTD., Gyeonggi-do (KR)

(72) Inventors: Yong Hyun Baek, Gyeonggi-do (KR); Ji Hun Kang, Gyeonggi-do (KR); Chae Hon Kim, Gyeonggi-do (KR); Ji Hoon Park, Gyeonggi-do (KR); So Ra Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/130,063

(22) Filed: Apr. 3, 2023

(65) Prior Publication Data
US 2023/0246122 A1      Aug. 3, 2023

Related U.S. Application Data

(63) Continuation of application No. 17/328,498, filed on May 24, 2021, now Pat. No. 11,621,370.
(Continued)

(51) Int. Cl.
*H01L 33/06* (2010.01)
*H01L 25/075* (2006.01)
(Continued)

(52) U.S. Cl.
CPC .......... *H01L 33/06* (2013.01); *G09G 3/2003* (2013.01); *G09G 3/32* (2013.01); *H01L 25/0753* (2013.01);
(Continued)

(58) Field of Classification Search
CPC ..... H01L 33/06; H01L 25/0753; H01L 33/24; H01L 33/32; H01L 33/62; H01L 33/382;
(Continued)

(56) References Cited

U.S. PATENT DOCUMENTS 9,287,367 B2    3/2016   Kwak et al.
10,522,716 B2  12/2019   Park et al.
(Continued)

FOREIGN PATENT DOCUMENTS

KR    100779945 B1   11/2007
KR    101236063 B1    2/2013
(Continued)

OTHER PUBLICATIONS

English translation of International Search Report for International Application No. PCT/KR2021/007502, dated Oct. 5, 2021, 4 pages.
(Continued)

*Primary Examiner* — Tracie Y Green
(74) *Attorney, Agent, or Firm* — LaBatt, LLC

(57) ABSTRACT

A lighting apparatus includes a light emitting diode, in which the light emitting diode includes an n-type nitride semiconductor layer, an active layer located on the n-type nitride semiconductor layer, and a p-type nitride semiconductor layer located on the active layer. The light emitting diode emits light that varies from yellow light to white light depending on a driving current.

20 Claims, 11 Drawing Sheets

Related U.S. Application Data

(60) Provisional application No. 63/041,201, filed on Jun. 19, 2020.

(51) Int. Cl.
|  |  |
| --- | --- |
| *H01L 33/24* | (2010.01) |
| *H01L 33/32* | (2010.01) |
| *H01L 33/62* | (2010.01) |
| *G09G 3/32* | (2016.01) |
| *G09G 3/20* | (2006.01) |
| *F21S 6/00* | (2006.01) |
| *F21Y 115/10* | (2016.01) |
| *F21W 107/30* | (2018.01) |
| *F21W 106/00* | (2018.01) |

(52) U.S. Cl.
CPC .............. *H01L 33/24* (2013.01); *H01L 33/32* (2013.01); *H01L 33/62* (2013.01); *F21S 6/003* (2013.01); *F21W 2106/00* (2018.01); *F21W 2107/30* (2018.01); *F21Y 2115/10* (2016.08); *G09G 2300/0452* (2013.01); *G09G 2320/0666* (2013.01)

(58) Field of Classification Search
CPC ...... H01L 33/025; G09G 3/2003; G09G 3/32; G09G 2300/0452; G09G 2320/0666; F21S 6/003; F21W 2106/00; F21W 2107/30; F21Y 2115/10
See application file for complete search history.

(56) References Cited

U.S. PATENT DOCUMENTS

| | | | |
|---|---|---|---|
| 11,049,995 | B2 | 6/2021 | Yoo et al. |
| 2009/0040154 | A1 | 2/2009 | Scheibe |
| 2013/0341593 | A1 | 12/2013 | Bergmann et al. |
| 2016/0087146 | A1 | 3/2016 | Yamane et al. |
| 2016/0087147 | A1 | 3/2016 | Yamane et al. |
| 2016/0270176 | A1 | 9/2016 | Robin et al. |
| 2018/0351039 | A1 | 12/2018 | Kim |
| 2019/0244938 | A1 | 8/2019 | Bang et al. |
| 2019/0295996 | A1 | 9/2019 | Park et al. |
| 2019/0337449 | A1 | 11/2019 | Diana et al. |
| 2021/0328100 | A1* | 10/2021 | Baek ...................... H01L 33/06 |
| 2022/0262983 | A1 | 8/2022 | Lee et al. |

FOREIGN PATENT DOCUMENTS

| | | |
|---|---|---|
| KR | 1020170063211 A | 6/2017 |
| KR | 1020180063687 A | 6/2018 |

OTHER PUBLICATIONS

Funato et al., Emission Color Tunable Light-Emitting Diodes Composed of InGaN Multifacet Quantum Wells, Applied Physics Letters, vol. 93, No. 021126, Jul. 14, 2008, American Institute of Physics, 4 pages.

Office Action issued in U.S. Appl. No. 17/328,498, dated Oct. 14, 2022, 15 pages.

Notice of Allowance issued in U.S. Appl. No. 17/328,498, dated Mar. 2, 2023, 7 pages.

\* cited by examiner

SINGLE CHIP MULTI BAND LED AND APPLICATION THEREOF

CROSS REFERENCE OF RELATED APPLICATION AND PRIORITY

The current application is a continuation of U.S. patent application Ser. No. 17/328,498, filed on May 24, 2021, which claims priority and benefit of the filing date of U.S. Provisional Application No. 63/041,201, filed Jun. 19, 2020, the disclosures of which are incorporated by reference in their entirety.

TECHNICAL FIELD

The present disclosure relates to a light emitting diode, and more particularly, to a light emitting diode that emits light having multi-bands at a single chip level and an application thereof.

BACKGROUND

A nitride semiconductor is used as a light source of a display apparatus, traffic light, lighting, or an optical communication device, and is mainly used in a light emitting diode or a laser diode that emits blue or green light. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light according to a composition of a well layer in the quantum well structure. In order to increase an internal quantum efficiency and reduce loss due to light absorption, the light emitting diode is designed to emit light of a spectrum having a single peak, that is, monochromatic light.

However, in general, lighting is implemented as mixed color light, such as white light. Moreover, in order to adjust a color temperature and luminance according to a user's preference, such as emotional lighting, it is desirable to implement various mixed colors of light. Lighting that requires mixed color light cannot be implemented with single-peak monochromatic light. Accordingly, a technique of implementing white light by using a plurality of light emitting diodes together emitting different monochromatic light from one another or by using a phosphor converting a wavelength of light emitted from the light emitting diode is generally used.

The use of phosphors is accompanied by drawbacks such as cost of the phosphor itself or a decrease in efficiency known as Stoke's shift. In particular, there are many drawbacks in a process of coating the phosphor on the light emitting diode and drawbacks such as yellowing of a carrier carrying the phosphor.

In addition, manufacturing a lighting apparatus by mixing a plurality of light emitting diodes complicates the process, and it is inconvenient to prepare light emitting diodes made of different materials.

Therefore, if light having a spectrum of multi-bands can be implemented using a single-chip light emitting diode, a plurality of light emitting diodes can be avoided, along with use of a phosphor, which can solve many existing drawbacks.

Meanwhile, in the field of a micro LED display, micro LEDs emitting red light, green light, and blue light are arranged to constitute a pixel for example. White light is exhibited when all of these micro LEDs are operated.

SUMMARY

Exemplary embodiments provide a light emitting diode of a novel structure capable of implementing light having a spectrum of multi-bands at a single chip level.

Exemplary embodiments provide a lighting apparatus capable of providing light of various colors using single chip level light emitting diodes.

Exemplary embodiments provide a micro LED display of a novel structure.

A lighting apparatus according to an exemplary embodiment includes a light emitting diode, in which the light emitting diode includes: an n-type nitride semiconductor layer, an active layer located on the n-type nitride semiconductor layer, and a p-type nitride semiconductor layer located on the active layer, and the light emitting diode emits light that varies from yellow light to white light depending on an driving current.

The light emitting diode may emit light having two peak wavelengths as a driving current increases.

In at least one variant, the light emitting diode may further include a V-pit generation layer disposed between the n-type nitride semiconductor layer and the active layer, and a portion of the active layer may be formed in a V-pit of the V-pit generation layer.

In another variant, the V-pit generation layer may have a thickness exceeding 450 nm, and the V-pits formed in the V-pit generation layer may include a V-pit having a width of an inlet exceeding 230 nm.

In further another variant, the light emitting diode may further include a p-type $Al_xGa_{1-x}N$ layer interposed between the active layer and the p-type nitride semiconductor layer, where a composition ratio x of Al in the p-type $Al_xGa_{1-x}N$ layer may be greater than 0 and less than 0.1.

For example, the p-type $Al_xGa_{1-x}N$ layer may have a thickness of 100 nm or less.

In another variant, the active layer may have a multi-quantum well structure having a plurality of well layers and a plurality of barrier layers, and may further include a capping layer covering the well layer between the well layer and the barrier layer, in which the capping layer may contain Al.

In an exemplary embodiment, the lighting apparatus may be installed inside a passenger plane.

In another exemplary embodiment, the lighting apparatus may be installed in a desk lamp.

A passenger plane according to an exemplary embodiment has a lighting apparatus therein, in which the lighting apparatus includes a light emitting diode, and the light emitting diode includes an n-type nitride semiconductor layer, an active layer located on the n-type nitride semiconductor layer, and a p-type nitride semiconductor layer located on the active layer, in which the light emitting diode emits light that varies from yellow light to white light depending on a driving current.

According to an exemplary embodiment, a micro LED display apparatus may include a display substrate, and a first light emitting diode, a second light emitting diode, a third light emitting diode, and a fourth light emitting diode arranged on the display substrate, in which the first to third light emitting diodes may emit monochromatic light of different colors from one another, and the fourth light emitting diode may emit light that varies from yellow light to white light depending on an driving current.

In at least one variant, the fourth light emitting diode may emit light having two peak wavelengths.

In another variant, the fourth light emitting diode may include an n-type nitride semiconductor layer, an active layer located on the n-type nitride semiconductor layer, a p-type nitride semiconductor layer located on the active layer, and a v-pit generation layer disposed between the n-type nitride semiconductor layer and the active layer, in which a portion of the active layer may be formed in a v-pit of the v-pit generation layer.

Further, the fourth light emitting diode may further include a p-type $Al_xGa_{1-x}N$ layer interposed between the active layer and the p-type nitride semiconductor layer, and a composition ratio x of Al in the p-type $Al_xGa_{1-x}N$ layer is greater than 0 and less than 0.1. For example, the p-type $Al_xGa_{1-x}N$ layer may have a thickness of 100 nm or less.

In further another variant, the active layer may have a multi-quantum well structure having a plurality of well layers and a plurality of barrier layers, and may further include a capping layer covering the well layer between the well layer and the barrier layer, in which the capping layer may contain Al.

In another variant, the micro LED display apparatus may further include a plurality of micro LED modules arranged on the display substrate, in which each of the micro LED modules may include a transparent substrate, and the first to fourth light emitting diodes may be arranged on the transparent substrate.

In another variant, the micro LED module may further include: a light absorption layer disposed between the transparent substrate and the first to fourth light emitting diodes; an adhesive layer bonding the first to fourth light emitting diodes to the light absorption layer; a step adjustment layer covering the first to fourth light emitting diodes and adhered to the adhesive layer; and connection layers disposed on the step adjustment layer, and electrically connected to the first to fourth light emitting diodes.

The first to fourth light emitting diodes may be arranged in a line on the transparent substrate.

Upon operation, the first to third light emitting diodes may be configured to emit red light, green light, and blue light, respectively, and the fourth light emitting diode may be configured to emit white light.

DETAILED DESCRIPTION OF EMBODIMENTS

Figure 1:
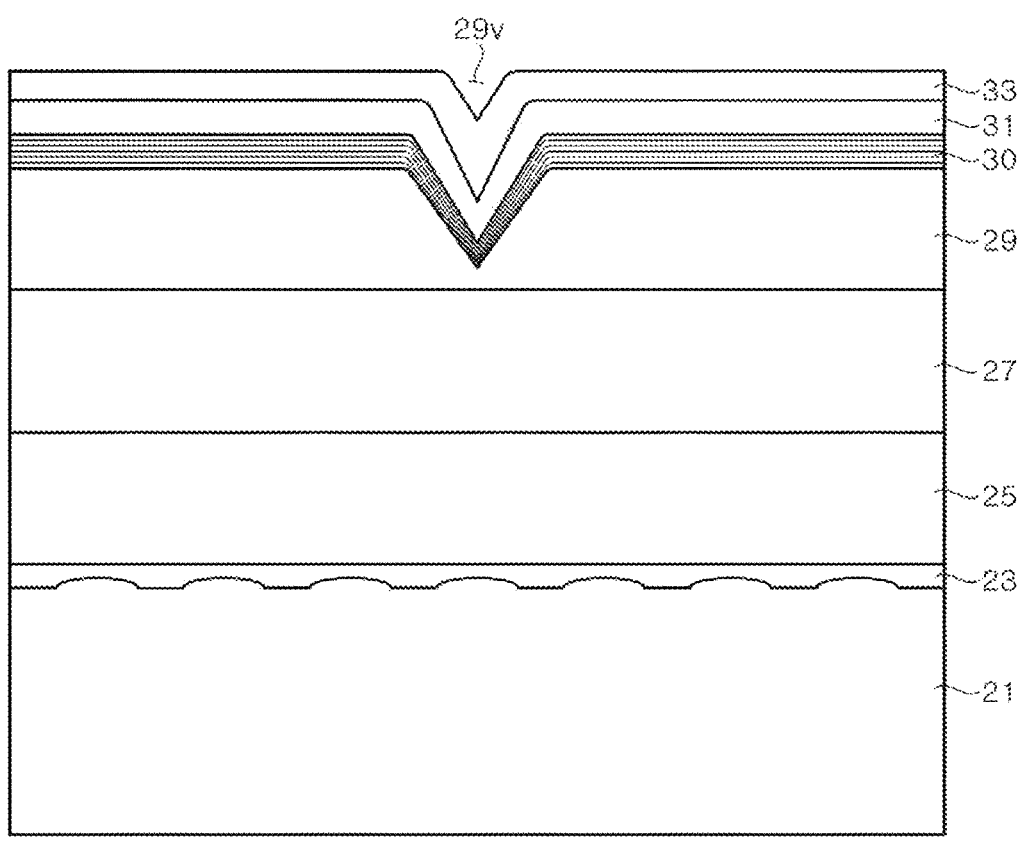
FIG. 1 is a schematic cross-sectional view illustrating a light emitting diode according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

Figure 2A:
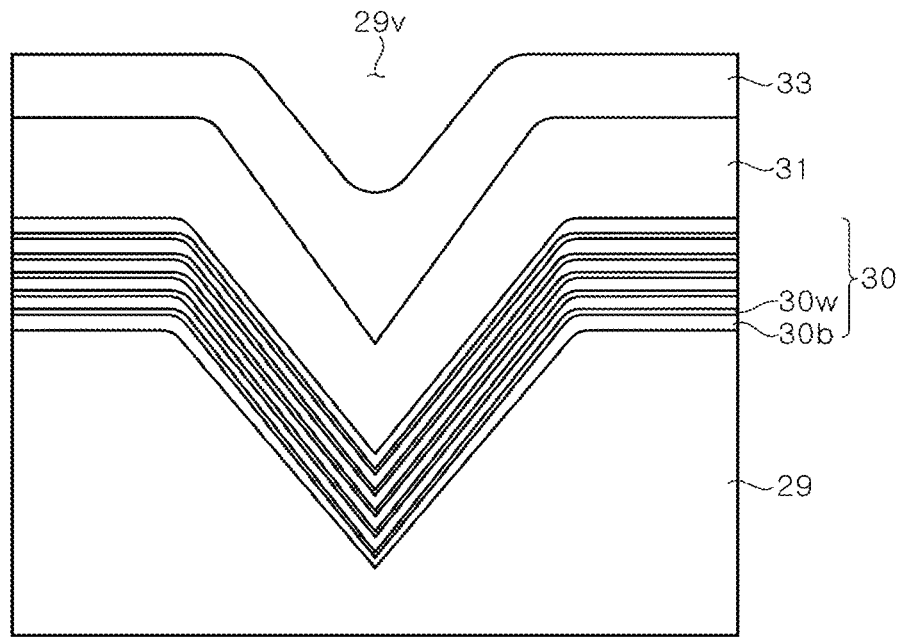
FIG. 2A is a schematic partial cross-sectional view showing an enlarged portion of FIG. 1 to describe a light emitting diode according to an exemplary embodiment.
Figure 2B:
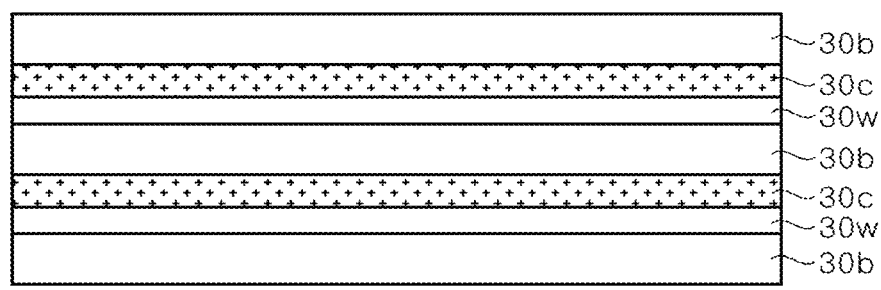
FIG. 2B is a schematic partial cross-sectional view showing an enlarged portion of FIG. 2A to describe a light emitting diode according to an exemplary embodiment.
Figure 3:
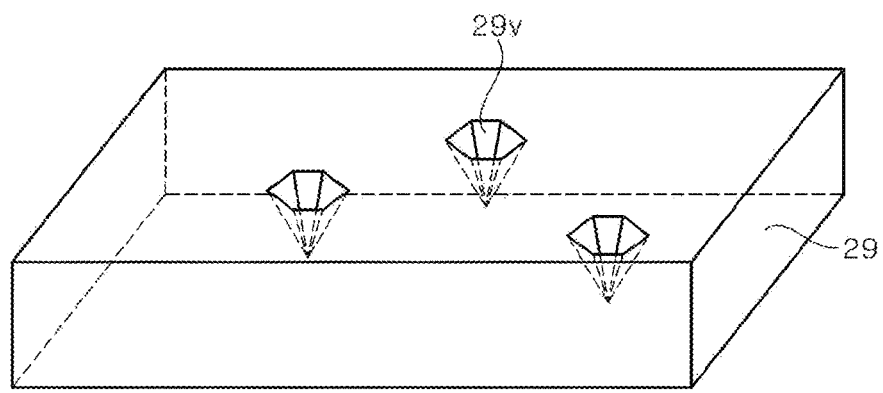
FIG. 3 is a schematic perspective view showing an enlarged V-pit generation layer to describe a light emitting diode according to an exemplary embodiment.

FIG. 1 is a schematic cross-sectional view illustrating a light emitting diode according to an exemplary embodiment, FIG. 2A is a schematic partial cross-sectional view showing an enlarged portion of FIG. 1 to describe the light emitting diode according to an exemplary embodiment, FIG. 2B is a schematic partial cross-sectional view showing an enlarged portion of FIG. 2A to describe the light emitting diode according to an exemplary embodiment, and FIG. 3 is a schematic perspective view showing an enlarged V-pit generation layer to describe the light emitting diode according to an exemplary embodiment.

First, referring to FIG. 1, the light emitting diode may include a substrate 21, a nucleation layer 23, a high-temperature buffer layer 25, an n-type nitride semiconductor layer 27, a V-pit generation layer 29, and an active layer 30, a p-type AlGaN layer 31, and a p-type nitride semiconductor layer 33.

The substrate 21 is for growing a gallium nitride-based semiconductor layer, and a sapphire substrate, a SiC substrate, a Si substrate, a spinel substrate, or the like may be used as the substrate 21. The substrate 21 may have protrusions as shown in FIG. 1, and may be, for example, a patterned sapphire substrate. However, the inventive concepts are not limited thereto, and may be a substrate having a flat upper surface thereof, for example, a sapphire substrate.

The nucleation layer 23 may be formed of (Al, Ga)N on the substrate 21 at a low temperature of 400° C. to 600° C., and for example, may be formed of AlGaN or GaN. A composition of the nucleation layer 23 may be changed according to the substrate 21. For example, when the substrate 21 is a patterned sapphire substrate, the nucleation layer 23 may be formed of AlGaN, and when the substrate 21 is a sapphire substrate having a flat upper surface, the nucleation layer 23 may be formed of GaN. The nucleation layer 23 may be formed to have a thickness of about 25 nm, for example.

The high-temperature buffer layer 25 may be grown at a relatively high temperature so as to mitigate occurrence of defects such as dislocations between the substrate 21 and the n-type nitride semiconductor layer 27. The high-temperature buffer layer 25 may be formed of undoped GaN or GaN doped with n-type impurities. While the high-temperature buffer layer 25 is being formed, threading dislocations are generated due to lattice mismatch between the substrate 21 and the high-temperature buffer layer 25. The high-temperature buffer layer 25 may be formed to have a thickness of, for example, about 4.2 µm.

The n-type nitride semiconductor layer 27 is a nitride-based semiconductor layer doped with n-type impurities, and may be formed of, for example, a GaN layer doped with Si. A doping concentration of Si doped to the n-type nitride semiconductor layer 27 may be from $5 \times e^{17}/cm^2$ to $5 \times e^{19}/cm^2$. The n-type nitride semiconductor layer 27 may be grown under a growth pressure of 150 Torr to 200 Torr at 1000° C. to 1200° C. (for example, 1050° C. to 1100° C.) by supplying a metal source gas into a chamber using MOCVD technology. In this case, the n-type nitride semiconductor layer 27 may be continuously formed on the high-temperature buffer layer 25, and the threading dislocations formed in the high-temperature buffer layer 25 may be transferred to the n-type nitride semiconductor layer 27. The n-type nitride semiconductor layer 27 may be formed to be relatively thinner than the high-temperature buffer layer 25, and may be formed to have, for example, a thickness of about 2.5 µm.

The V-pit generation layer 29 is located over the n-type nitride semiconductor layer 27. In some forms, the V-pit generation layer 29 may be formed of, for example, a GaN layer. The V-pit generation layer 29 may be grown at a temperature relatively lower than the temperature for growing the n-type nitride semiconductor layer 27, for example, about 900° C., and thus, V-pits are formed in the V-pit generation layer 29.

Since the V-pit generation layer 29 is grown at a relatively lower temperature than that for growing the n-type nitride semiconductor layer 27, crystal quality may be artificially degraded and promote three-dimensional growth, and thus, a V-pit 29v may be formed.

As shown in FIG. 3, when a growth surface of the nitride semiconductor layer is a C-plane, the V-pits 29v may have a hexagonal cone shape. The V-pits 29v may be formed at upper ends of the threading dislocations.

The V-pit generation layer 29 may be formed to have a thickness thinner than that of the n-type nitride semiconductor layer 27, and may be formed to have, for example, a thickness of about 450 nm to 600 nm. A size of the V-pits 29v formed in the V-pit generation layer 29 may be adjusted through a growth condition and a growth time of the V-pit generation layer 29. In some forms, a maximum width of an inlet of the V-pit 29v formed in the V-pit generation layer 29 may generally exceed about 230 nm.

The thickness of the V-pit generation layer 29 particularly affects the size of the V-pit 29v. Moreover, the size of the V-pit 29v is considered to have an effect on generating light having a spectrum of multi-bands.

In some forms, the V-pit generation layer 29 is exemplarily described as being a single layer, but the inventive concepts are not limited thereto, and in other forms, the V-pit generation layer 29 may be multiple layers. For example, the V-pit generation layer 29 may include at least two layers among GaN, AlGaN, InGaN, or AlGaInN layers.

The active layer 30 is located on the V-pit generation layer 29. The active layer 30 emits light by recombination of electrons and holes. In addition, the active layer 30 may have a single quantum well structure or a multiple quantum well (MQW) structure in which barrier layers 30b and well layers 30w are alternately stacked.

The active layer 30 may contact the V-pit generation layer 29, but the inventive concepts are not limited thereto. The active layer 30 may be formed along the V-pit 29v. A thickness of the active layer 30 formed in the V-pit 29v is smaller than that of the active layer 30 formed on a flat surface of the V-pit generation layer 29. The thickness of the active layer 30 in the V-pit 29v may vary depending on a depth of the V-pit 29v. At an intermediate depth of the V-pit 29v, the thickness of the active layer 30 may be less than about ⅓ of the thickness of the active layer 30 formed on the flat surface of the V-pit generation layer 29. In particular, a thickness of the well layer 30w at the intermediate depth of the V-pit 29v may be less than about ⅓ of the thickness of the well layer 30w formed on the flat surface of the V-pit generation layer 29.

Meanwhile, the well layer 30w may be formed of $In_xAl_yGa_{1-x-y}N$ ($0 < x < 1$, $0 \leq y < 1$). A composition ratio of In, Al, and Ga may be selected according to required light. In particular, the well layer 30w (hereinafter, a first well layer portion) formed on the flat surface of the V-pit generation layer 29 has a composition that emits light having a longer wavelength spectrum of the multi-bands. Meanwhile, the well layer 30w (hereinafter, a second well layer portion) formed in the V-pit 29v has a composition that emits light having a shorter wavelength spectrum of the multi-bands. For example, an In composition ratio in the first well layer portion is higher than that in the second well layer portion, the first well layer portion may be formed of InGaN to emit yellow light, and the second well layer portion may be formed of InGaN to emit green and/or blue light.

The second well layer portion may be formed with an identical composition on each side surface of the V-pit 29v, but the inventive concepts are not limited thereto, and may be formed with a different composition from one another on each side surface. As such, the light emitting diode of the present disclosure may implement light having at least two bands at a single chip level using the first well layer portion and the second well layer portion which emit light having different wavelength bands.

The barrier layer 30b may be formed of a nitride semiconductor layer such as GaN, InGaN, AlGaN, AlInGaN, or the like, which has a wider band gap than that of the well layer 30w. For example, when the first well layer portion is formed of InGaN to emit yellow light, the barrier layer 30b may be formed of InGaN having a lower In content than that of the well layer 30w.

Meanwhile, as shown in FIG. 2B, a capping layer 30c may be interposed between the well layer 30w and the barrier layer 30b. The capping layer 30c may be formed before the deposition of the barrier layer 30b to prevent Indium (In) in the well layer 30w from being dissociated while the barrier layer 30b is deposited. The capping layer 30c may include Al, and may be formed of, for example, AlGaN or AlInGaN. An Al composition of a first capping layer portion, that is, a capping layer portion disposed on the flat surface of the V-pit generation layer 29, and an Al composition of a second capping layer portion, that is, a capping layer portion formed in the V-pit 29v may be different from each other. The Al content in the first capping layer portion is higher than that in the second capping layer portion. For example, the Al composition in the first capping layer portion may be 10 atomic % or more, further 12 atomic % or more with respect to a total Al composition in the capping layer, and the Al composition in the second capping layer portion may be about 5 atomic % or more with respect to the total Al composition in the capping layer.

Remaining capping layers 30c, except for a last capping layer 30c closest to the p-type nitride semiconductor layer 33, may be formed to have a thickness substantially similar to or smaller than that of an adjacent well layer 30w. The last capping layer 30c may be formed thicker than the well layer 30w adjacent thereto.

The p-type AlGaN layer 31 is located on the active layer 30. The p-type AlGaN layer 31 may also be formed in the V-pit 29v. A composition ratio of Al in the p-type AlGaN layer 31 is relatively low compared to a composition ratio of Al used in an electron blocking layer. In addition, the composition ratio of Al in the p-type AlGaN layer 31 may be smaller than that in the capping layer 30c. For example, the p-type AlGaN layer 31 may be represented by a general formula $Al_xGa_{1-x}N$, where x may be greater than 0 and less than 0.1. Meanwhile, in an exemplary embodiment, a thickness of the p-type AlGaN layer 31 may be less than about 100 nm, and in a particular exemplary embodiment, it may be about 70 nm.

The p-type nitride semiconductor layer 33 may be formed of a semiconductor layer, for example, GaN doped with a p-type impurity such as Mg. The p-type nitride semiconductor layer 33 may be a single layer or multiple layers, and may include a p-type contact layer. As shown in FIG. 1, the p-type nitride semiconductor layer 33 may have a concave groove in the V-pit 29v. Since the p-type nitride semiconductor layer 33 does not completely fill the V-pit 29v, loss of light generated in the well layer 30w in the V-pit 29v may be prevented.

Light emitting diodes may be manufactured in various types such as a lateral type, a flip-chip type, or others. As lateral light emitting diodes are well known, descriptions thereof will be omitted.

Figure 4:
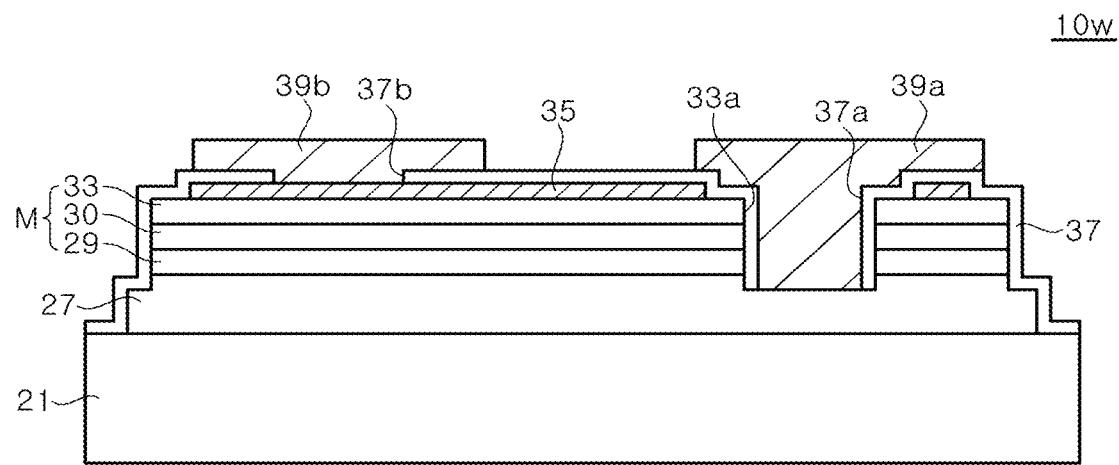
FIG. 4 is a schematic cross-sectional view showing a flip-chip type light emitting diode according to an exemplary embodiment.

FIG. 4 is a schematic cross-sectional view showing a flip-chip type light emitting diode 10w according to an exemplary embodiment.

Referring to FIG. 4, the flip-chip type light emitting diode 10w may include a substrate 21, an n-type nitride semiconductor layer 27, a V-pit generation layer 29, an active layer 30, and a p-type nitride semiconductor layer 33, as described with reference to FIG. 1. In addition, although not shown in the drawing, as described with reference to FIG. 1, a nucleation layer 23 and a high-temperature buffer layer 25 may be disposed between the substrate 21 and the n-type nitride semiconductor layer 27, and a p-type AlGaN layer 31 may be disposed between the active layer 30 and the p-type nitride semiconductor layer 33. Since these are the same as described with reference to FIGS. 1, 2A, 2B, and 3, repeated detailed descriptions thereof will be omitted to avoid redundancy.

A mesa M may be formed on the n-type nitride semiconductor layer 27. An upper surface near an edge of the n-type nitride semiconductor layer 27 may be exposed by the mesa M. Meanwhile, a through hole 33a may be formed through the p-type nitride semiconductor layer 33, the active layer 30, and the v-pit generation layer 29 to expose the n-type nitride semiconductor layer 27.

Meanwhile, the flip-chip light emitting type diode 10w further includes an ohmic contact layer 35, an insulation layer 37, a first electrode pad 39a, and a second electrode pad 39b.

The ohmic contact layer 35 is disposed on the p-type nitride semiconductor layer 33 to be in ohmic contact with the p-type nitride semiconductor layer 33. The ohmic contact layer 35 may be formed of a single layer or multiple layers, and may be formed of a transparent conductive oxide layer or a metallic layer. The transparent conductive oxide layer may be, for example, ITO ZnO, or the like, and the metallic layer may be a metal such as Al, Ti, Cr, Ni, Au, or the like and an alloy thereof.

The insulation layer 37 covers the ohmic contact layer 27 and the p-type nitride semiconductor layer 33. Furthermore, the insulation layer 37 may also cover side surfaces of the semiconductor layers, and may cover an upper surface of the exposed substrate 21.

Meanwhile, the insulation layer 37 may have an opening 37a exposing the n-type nitride semiconductor layer 27 and an opening 37b exposing the ohmic contact layer 35 in the through hole 33a. The insulation layer 37 may be formed of a single layer or multiple layers of a silicon oxide layer or a silicon nitride layer. In addition, the insulation layer 37 may include an insulating reflector such as a distributed Bragg reflector.

The first electrode pad 39a and the second electrode pad 39b are disposed on the insulation layer 37. The first electrode pad 39a may be electrically connected to the n-type nitride semiconductor layer 27 through the opening 37a, and the second electrode pad 39b may be electrically connected to the ohmic contact layer 35 through the opening 37b.

The first and/or second electrode pads 39a and 39b may be formed of a single layer or a multilayer metal. As a material of the first and/or second electrode pads 39a and 39b, metals such as Al, Ti, Cr, Ni, Au, and alloys thereof may be used.

Although the light emitting diode 10w according to the exemplary embodiment has been briefly described with reference to FIG. 4, the light emitting diode 10w may further include a layer having an additional function along with those of the above-described layer. For example, various layers such as a reflection layer that reflects light, an additional insulation layer to insulate a specific component, and an anti-solder layer to prevent diffusion of solder may be further included.

In addition, in forming the flip-chip type light emitting diode, the mesa M may be formed in various forms, and locations and shapes of the first and second electrode pads 39a and 39b may also be variously modified. Further, the ohmic contact layer 35 may be omitted, and the second electrode pad 39b may directly contact the p-type nitride semiconductor layer 33. Moreover, although the first electrode pad 39a is shown to be directly connected to the n-type nitride semiconductor layer 27, a contact layer is first formed on the n-type nitride semiconductor layer 27 exposed to the through hole 33a, and then, the first electrode pad 39a may be connected to the contact layer.

The flip-chip type light emitting diode 10w includes the V-pit described above, and has emission peaks at a plurality of wavelengths.

According to the illustrated exemplary, it is possible to provide the flip-chip type light emitting diode 10w capable of implementing white light without a phosphor. Since a phosphor process for manufacturing the white light diode may be omitted, a production cost may be reduced, and further, a white light source having a thin thickness reduced by a thickness of the phosphor may be applied to an application product.

Figure 5A:
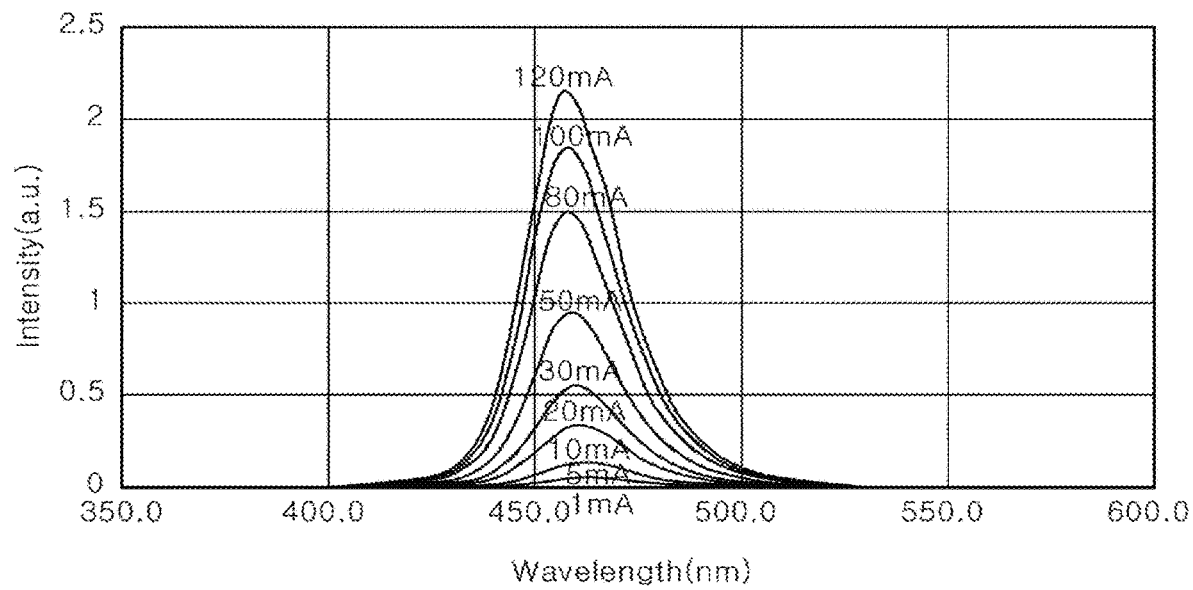
FIG. 5A is a graph showing a spectrum depending on currents of a blue light emitting diode of Comparative Example.
Figure 5B:
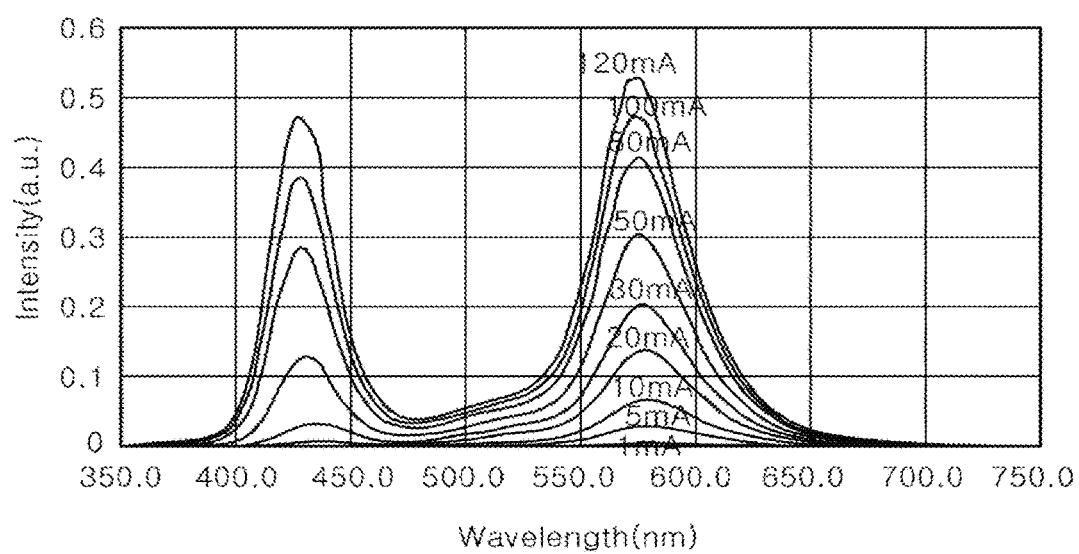
FIG. 5B is a graph showing a spectrum depending on currents of a light emitting diode according to an exemplary embodiment.

FIG. 5A is a graph showing a spectrum depending on currents of a typical blue light emitting diode, and FIG. 5B is a graph showing a spectrum depending on currents of a light emitting diode according to an exemplary embodiment.

Referring to FIG. 5A, in the typical blue light emitting diode, an intensity of blue light having a single peak wavelength increases as a current increases. Therefore, it is difficult to implement white light only with a conventional blue light emitting diode, and a light emitting diode of another color other than the blue light emitting diode needs to be added or a phosphor needs to be used so as to implement white light.

Referring to FIG. 5B, the light emitting diode according to an exemplary embodiment of the present disclosure has a peak wavelength at a low current in a yellow region, and peak wavelengths at a high current in a blue region as well as the yellow region. That is, the light emitting diode according to the exemplary embodiment may implement mixed color light, such as white light, in which blue light and yellow light are mixed as a driving current increases.

Figure 6:
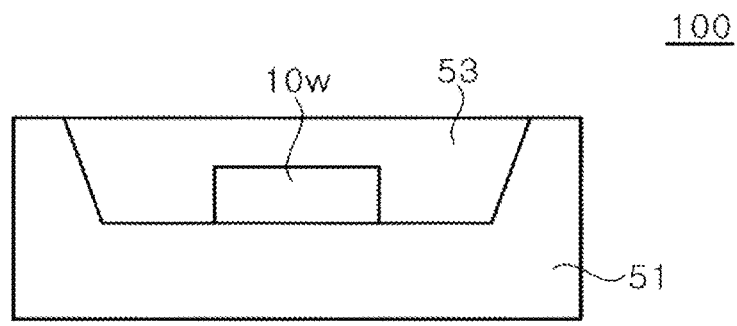
FIG. 6 is a schematic cross-sectional view illustrating a light emitting diode package according to an exemplary embodiment.

FIG. 6 is a schematic cross-sectional view illustrating a light emitting diode package 100 according to an exemplary embodiment.

Referring to FIG. 6, the light emitting diode package 100 may include a housing 51, a light emitting diode 10w, and a molding member 53. The housing 51 may include a recess region for mounting the light emitting diode 10w. Further, although not illustrated in the drawing, leads for transmitting external power to the light emitting diode 10w may be installed in the housing 51.

The light emitting diode 10w shown in FIG. 6 may include semiconductor layers as described with reference to FIG. 1, and as shown in FIG. 5B, may emit yellow light under the low current, and may emit mixed color light having a plurality of peak wavelengths under the high current. The light emitting diode 10w may have an identical structure as that described with reference to FIG. 4, and detailed descriptions thereof will be omitted. However, the light emitting diode 10w is not necessarily limited to the flip chip type, and may be a lateral or a vertical light emitting diode, or may be a light emitting diode having a plurality of light emitting cells.

Figure 7A:
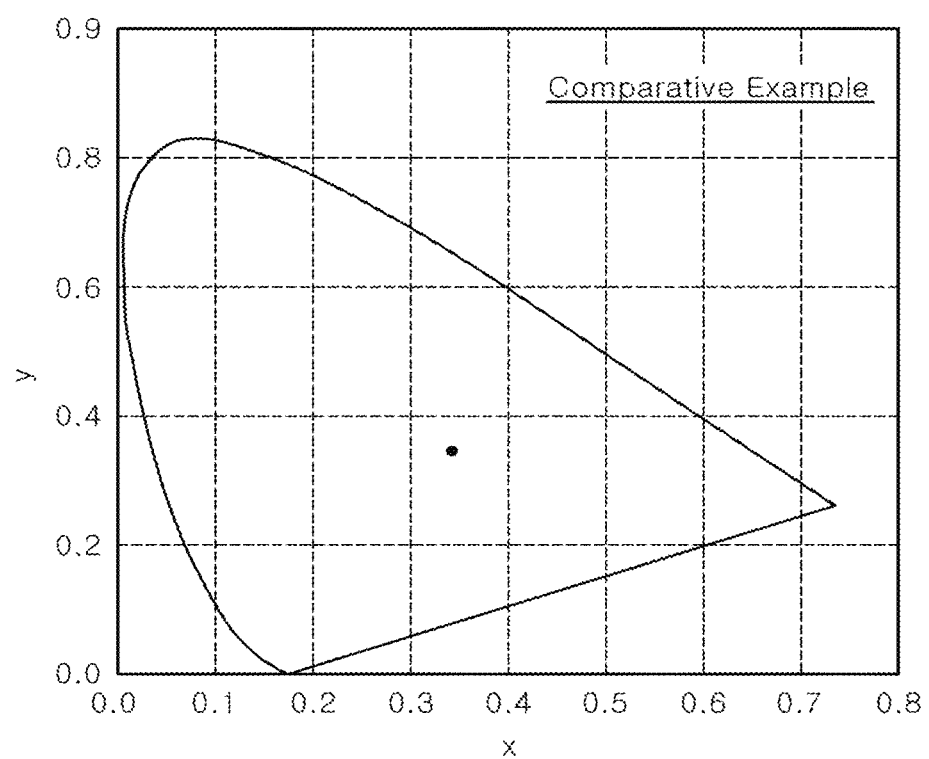
FIG. 7A is a graph showing color coordinates of a white light emitting diode package in Comparative Example.
Figure 7B:
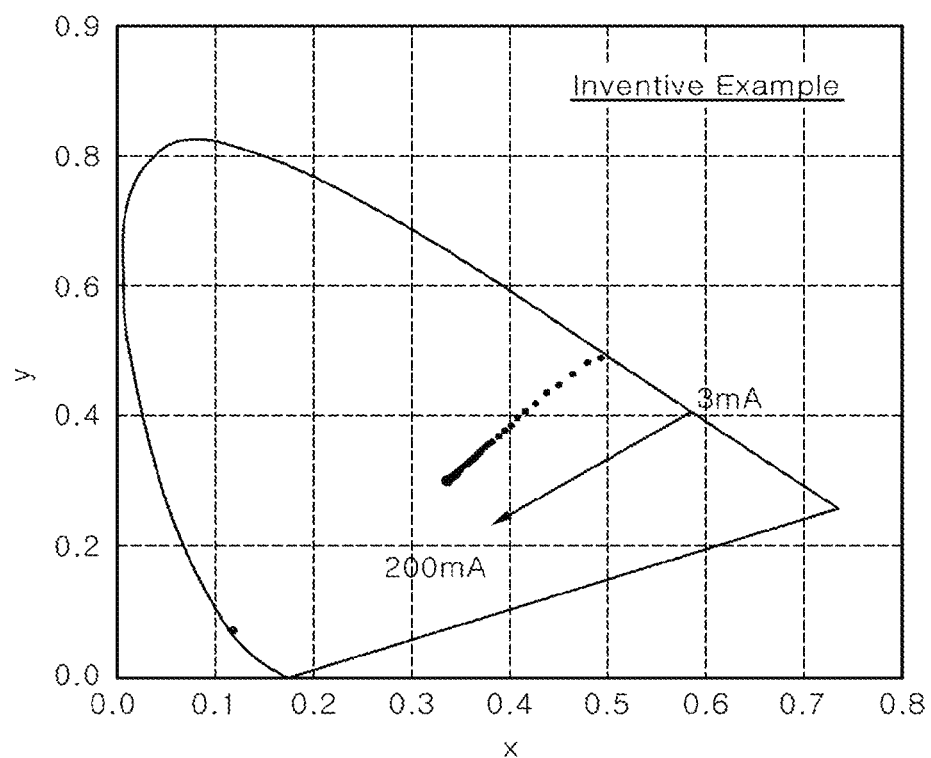
FIG. 7B is a graph illustrating color coordinates depending on currents of a light emitting diode package according to an exemplary embodiment.

FIG. 7A is a graph showing color coordinates of a typical white light emitting diode package (Comparative Example) to which a phosphor is applied, and FIG. 7B is a graph illustrating color coordinates depending on currents of a white light emitting diode package (Inventive Example) according to an exemplary embodiment. Herein, the light emitting diode packages of Comparative Example and Inventive Example were all manufactured using a 5630 package of Seoul Semiconductor. However, in the Comparative Example, a blue chip was mounted in the package, and a molding member having a phosphor spread therein was used to implement white light. In contrast, in the Inventive Example, a light emitting chip according to an exemplary embodiment of the present disclosure was mounted in the package.

First, referring to FIG. 7A, the light emitting diode package of Comparative Example exhibits color coordinates of one point, and this location corresponds to a white region.

Referring to FIG. 7B, in the light emitting diode package of Inventive Example, as the current increases, color of light emitted changes from yellow light to white light. As indicated by arrows in FIG. 7B, the light emitting diode package of the exemplary embodiment exhibits yellow light under a current condition of 3 mA, but it exhibits white light at 100 mA.

Electrical and optical characteristics of Comparative Example and Inventive Example under a driving current of 100 mA are briefly summarized in Table 1.

TABLE 1

| PKG @ 100 mA | Voltage (V) | x-coordinate | y-coordinate | CCT/K |
|---|---|---|---|---|
| Comparative Example | 3.0 | 0.34 | 0.35 | 5096 |
| Inventive Example | 3.1 | 0.36 | 0.34 | 4264 |

Referring to Table 1, it can be seen that the light emitting diode package of Inventive Example exhibits x-y coordinates substantially similar to those of the white light emitting diode package of Comparative Example using a phosphor.

The light emitting diode according to the exemplary embodiments may emit light having a plurality of peak wavelengths in a visible light region without using the phosphor, and by using this, it may implement white light without the phosphor.

Since the light emitting diode according to the exemplary embodiments emits light having a plurality of distinct peak wavelengths, it is possible to extract and use light having a desired peak wavelength using a color filter.

Figure 8:
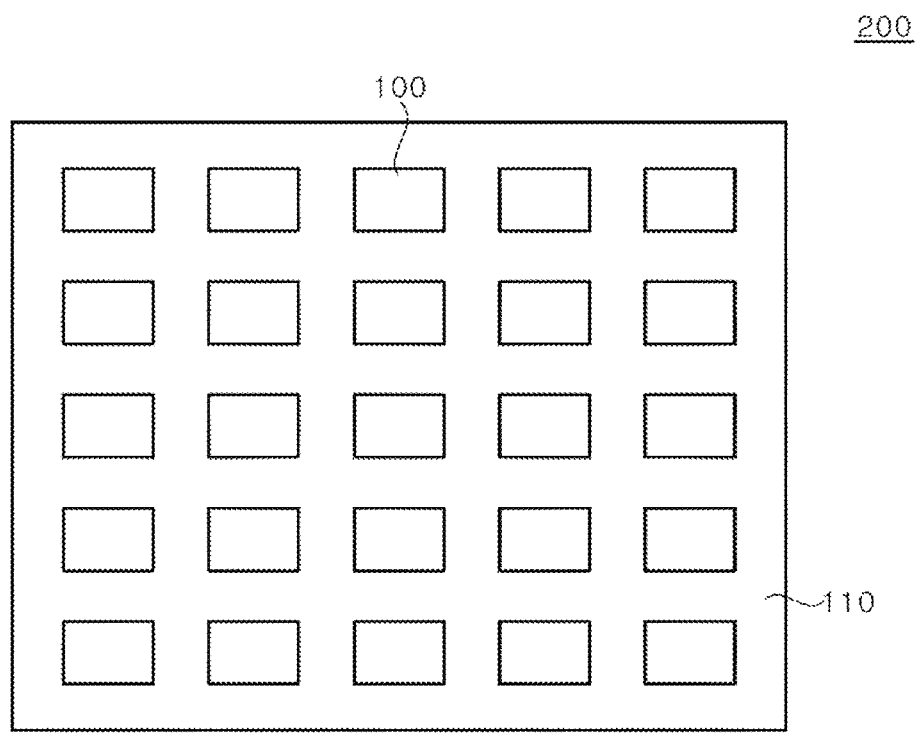
FIG. 8 is a schematic plan view illustrating a lighting apparatus according to an exemplary embodiment.

FIG. 8 is a schematic plan view illustrating a lighting apparatus 200 according to an exemplary embodiment.

Referring to FIG. 8, the lighting apparatus 200 may include a circuit board 110 and a plurality of light emitting diode packages 100.

The circuit board 110 may have wirings for supplying power to the light emitting diode packages 100. In some forms, the circuit board 110 may have a plate shape.

The light emitting diode package 100 is the same as the light emitting diode package 100 described with reference to FIG. 6, and a detailed description thereof will be omitted. As described with reference to FIG. 7B, the light emitting diode package 100 may emit yellow light under a relatively low current, and may emit white light under a relatively high current.

The lighting apparatus 200 may adjust color of light emitted from yellow light to white light by adjusting the current, and thus, it is possible to implement various lighting conditions based on different preferences of users.

In the illustrated exemplary embodiment, it is described by way of example that the light emitting diode package installed in the lighting apparatus 200 is the light emitting diode package 100 of FIG. 6, but the light emitting diode package is not limited to a specific structure.

In addition, in the illustrated exemplary embodiment, although the lighting apparatus 200 is exemplarily illustrated and described as the lighting apparatus 200 being a planar lighting apparatus, the inventive concepts are not limited to the planar lighting apparatus, but may be applied to various lighting apparatuses, for example, a bar type such as a light bulb or a fluorescent lamp.

Figure 9:
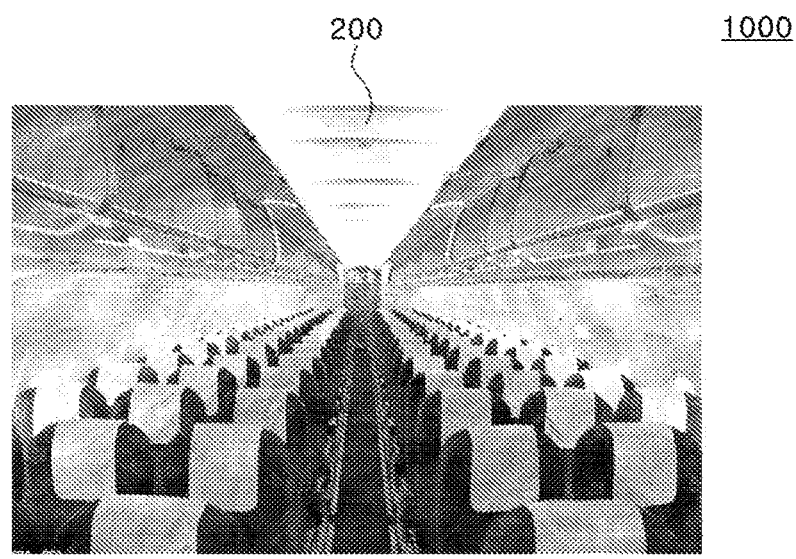
FIG. 9 is a view showing an interior of a passenger plane in which a lighting apparatus according to an exemplary embodiment is installed.

FIG. 9 is a view showing an interior of a passenger plane 1000 in which the lighting apparatus 200 according to an exemplary embodiment is installed.

Referring to FIG. 9, the lighting apparatus 200 may be installed on a ceiling inside the passenger plane 1000. The lighting apparatus 200 may implement from yellow light to cool white light depending on a current.

Since the lighting apparatus 200 is installed inside the passenger plane 1000 which flies for a long time, a high current may be injected during the day to illuminate the interior with white light, and a relatively low current may be injected at night to illuminate the interior with yellowish light. As such, the lighting inside the passenger plane 1000 may be maintained similarly to the natural light of an environment outside the passenger plane.

Although the lighting apparatus 200 is exemplarily illustrated and described as being used as the indoor lighting apparatus of the passenger plane 1000 in the illustrated exemplary embodiment, the lighting apparatus 200 is not limited to the interior lighting apparatus of the passenger plane 1000. For example, the lighting apparatus 200 may be used as a reading lamp inside the passenger plane 1000, and may also be used as a desk lamp to provide a lighting with optimal color temperature that may improve a user's focus.

Figure 10:
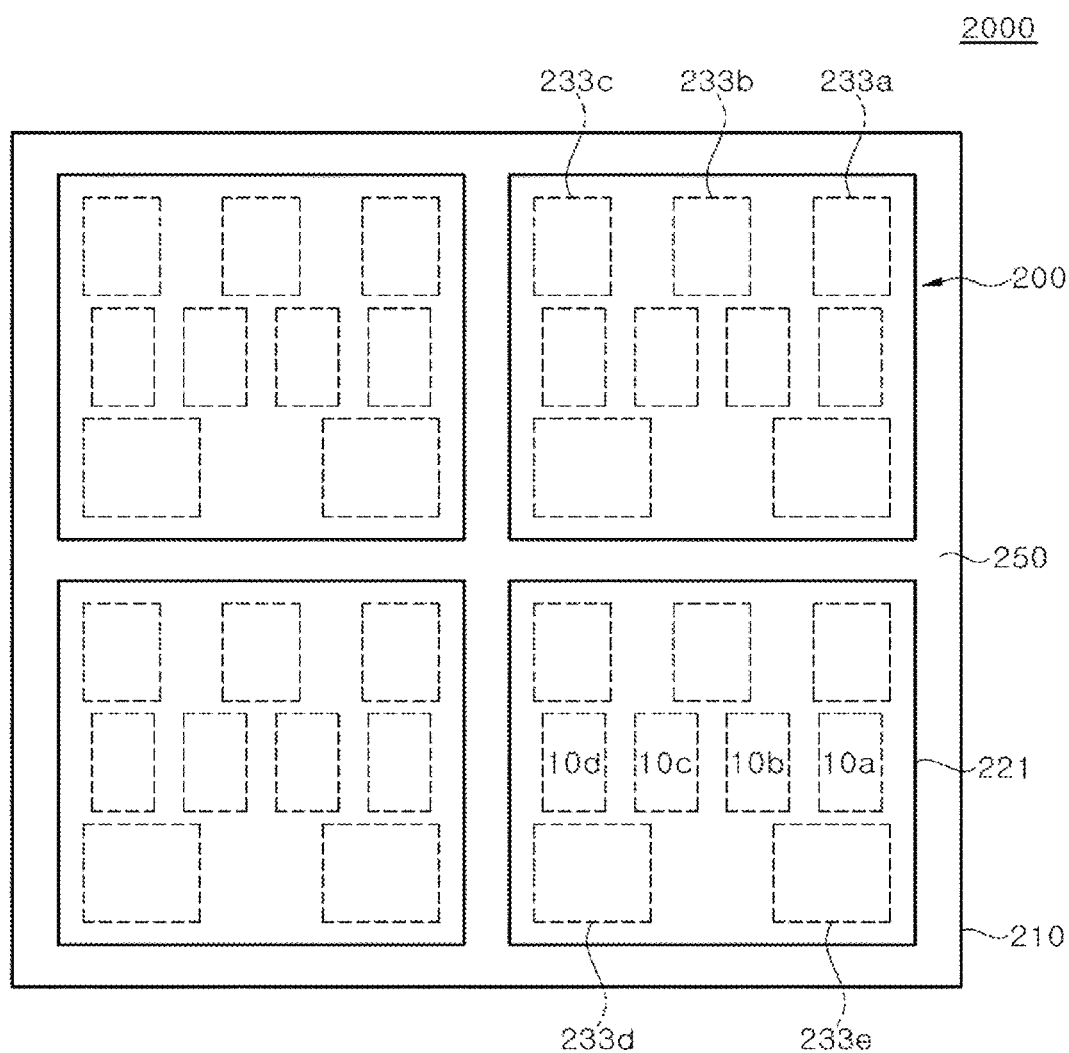
FIG. 10 is a schematic plan view illustrating a micro LED display apparatus according to an exemplary embodiment.

FIG. 10 is a schematic plan view illustrating a micro LED display apparatus 2000 according to an exemplary embodiment.

Referring to FIG. 10, the micro LED display apparatus 2000 may include a display substrate 210, a plurality of micro LED modules 200, and a cover layer 250.

The display substrate 210 may have a circuit for electrically connecting light emitting diodes 10a, 10b, 10c, and 10d. The circuit in the display substrate 210 may be formed in a multilayer structure. The display substrate 210 may also include a passive circuit for driving the light emitting diodes 10a, 10b, 10c, and 10d by a passive matrix driving method or an active circuit for driving them by an active matrix driving method. The display substrate 210 may include pads exposed on a surface thereof.

The plurality of micro LED modules 200 may be arranged on the display substrate 210. The micro LED module 200 may include a transparent substrate 221, micro-scale light emitting diodes 10a, 10b, 10c, and 10d, and bump pads 233a, 233b, 233c, 233d, and 233e. A specific configuration of the micro LED module 200 will be described in detail later with reference to FIGS. 11, 12, 13, and 14.

The micro LED modules 200 may be arranged in a matrix shape on the display substrate 210. The bump pads 233a, 233b, 233c, 233d, and 233e of the micro LED modules 200 may be bonded to the pads exposed on the surface of the display substrate 210.

In some forms, the plurality of micro LED modules 200 is arranged on the display substrate 210 to implement an entire image with one display substrate 210. In another form, the plurality of display substrates 210 on which the micro LED modules 200 are disposed may be tiled on another substrate to implement the entire image.

The cover layer 250 covers the plurality of micro LED modules 200. The cover layer 250 may improve an image contrast of the display apparatus by preventing light interference between the micro LED modules 200.

The cover layer 250 may be formed of, for example, a dry-film type solder resist (DFSR), a photoimageable solder resist (PSR), a black material (BM), an epoxy molding compound (EMC), or the like. The cover layer 250 may be formed using, for example, lamination, spin coating, slit coating, printing, or the like. In some forms, the cover layer 250 may be omitted.

Figure 11:
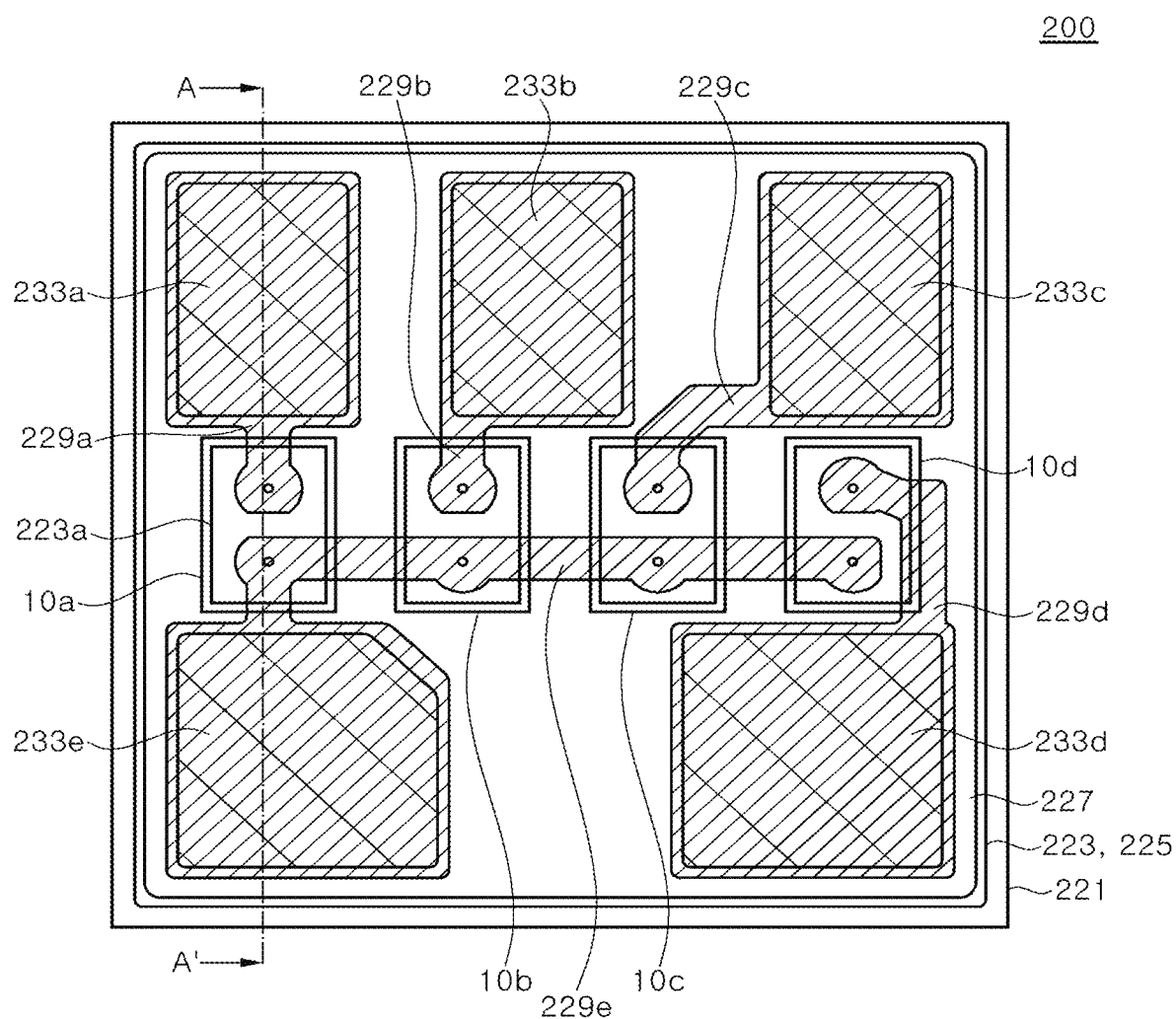
FIG. 11 is a schematic plan view illustrating a micro LED module according to an exemplary embodiment.
Figure 12:
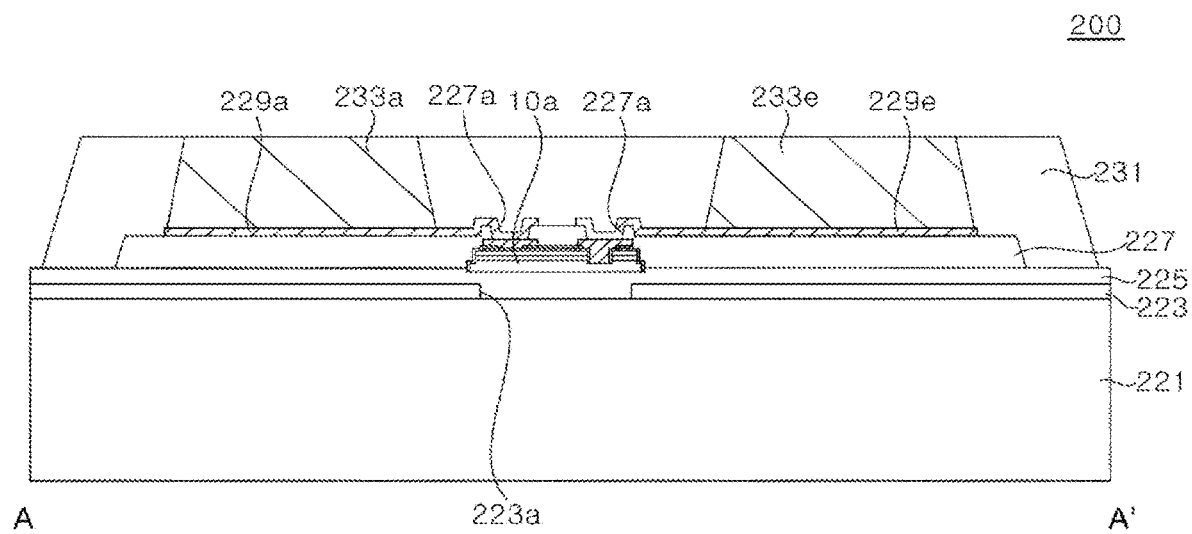
FIG. 12 is a schematic cross-sectional view taken along line A-A' of FIG. 11.

FIG. 11 is a schematic plan view illustrating a micro LED module 200 according to an exemplary embodiment, and FIG. 12 is a schematic cross-sectional view taken along line A-A' of FIG. 11.

Referring to FIGS. 11 and 12, the micro LED module 200 may include a transparent substrate 221, first to fourth light emitting diodes 10a, 10b, 10c, and 10d, a light absorption layer 223, an adhesive layer 225, a step adjustment layer 227, connection layers 229a, 229b, 229c, 229d, and 229e, bumps 233a, 233b, 233c, 233d, and 233e, and a protection layer 231.

The micro LED module 200 provides one pixel including the first to fourth light emitting diodes 10a, 10b, 10c, and 10d. The first to third light emitting diodes 10a, 10b, and 10c emit light of different colors from one another, each of which corresponds to a sub-pixel. Each of the first to third light emitting diodes 10a, 10b, and 10c may emit red light, green light, and blue light, respectively. Meanwhile, as described above with reference to FIG. 1, the fourth light emitting diode 10d may emit white light without a phosphor. Specific structures of the first to fourth light emitting diodes 10a, 10b, 10c, and 10d will be described in detail later with reference to FIGS. 13 and 14.

The transparent substrate 221 is a light-transmitting substrate such as PET, glass substrate, quartz, sapphire substrate, or the like. Light emitted from the light emitting diodes 10a, 10b, 10c, and 10d is emitted to the outside through the transparent substrate 221. The transparent substrate 221 may include regular or irregular patterns on a surface facing or opposite to the light emitting diodes 10a, 10b, 10c, and 10d. Light emission efficiency may be improved through the patterns, and more uniform light may be emitted. The transparent substrate 221 may also include an anti-reflective coating, or may include an anti-glare layer or may be treated with an anti-glare treatment. The transparent substrate 221 may have a thickness of, for example, about 50 μm to about 500 μm.

Meanwhile, although one unit pixel is illustrated as being formed on one transparent substrate 221, a plurality of unit pixels may be formed on one transparent substrate 221.

The light absorption layer 223 may include an absorbing material that absorbs light, such as PDMA, black EMC, or carbon black. The light absorbing material prevents light generated in the light emitting diodes 10a, 10b, 10c. 10d from leaking to a side in a region between the transparent substrate 221 and the light emitting diodes 10a, 10b, 10c, and 10d, and improves an image contrast of the display apparatus. The light absorption layer 223 is disposed on paths of light generated in the light emitting diodes 10a, 10b, 10c, and 10d. The light absorption layer 223 may also have windows 223a between the light emitting diodes 10a, 10b, 10c, and 10d and the transparent substrate 221. The windows 223a assist light emitted from the light emitting diodes 10a, 10b, 10c, and 10d to be emitted to the transparent substrate 221 without being lost by the light absorption layer 223. In some forms, the light absorption layer 223 may be omitted. In this case, a thickness of the light absorption layer 223 is controlled so that light emitted from the light emitting diodes 10a, 10b, 10c, and 10d may pass through the light absorption layer 223 without significant loss in the vertical direction.

The adhesive layer 225 is attached onto the transparent substrate 221. The adhesive layer 225 may cover the light absorption layer 223. The adhesive layer 225 may be attached to an entire surface of the transparent substrate 221, but the inventive concepts are not limited thereto, The adhesive layer 225 may be attached to a partial region of the transparent substrate 221 to expose a region near an edge of the transparent substrate 221. The adhesive layer 225 is used to attach the light emitting diodes 10a, 10b, 10c, and 10d to the transparent substrate 221.

The adhesive layer 225 may be formed as a light-transmitting layer, and transmits light emitted from the light emitting diodes 10a, 10b, 10c, and 10d. The adhesive layer 225 may include a diffuser such as $SiO_2$, $TiO_2$, ZnO, or the like to diffuse light. The light diffusing material prevents the light emitting diodes 10a, 10b, 10c, and 10d from being observed from a light exiting surface.

Meanwhile, the first to fourth light emitting diodes 10a, 10b, 10c, and 10d are disposed on the transparent substrate 221. The first to fourth light emitting diodes 10a, 10b, 10c, and 10d may be attached to the transparent substrate 221 by the adhesive layer 125.

As illustrated in FIG. 11, the first to fourth light emitting diodes 10a, 10b, 10c, and 10d may be arranged in a line. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting diodes 10a, 10b, 10c, and 10d. For example, in FIG. 11, the clean-cut surfaces (e.g., m-plane) may be disposed up and down, and the two remaining cut surfaces (e.g., a-plane) may be disposed left and right.

The step adjustment layer 227 covers the first to fourth light emitting diodes 10a, 10b, 10c, and 10d. The step adjustment layer 227 has openings 227a exposing electrode pads of the light emitting diodes 10a, 10b, 10c, and 10d. The step adjustment layer 227 is used to form the connection layers 229a, 229b, 229c, 229d, and 229e and the bumps 233a, 233b, 233c, 233d, and 233e. In particular, the step adjustment layer 227 may be formed to equalize elevations of locations where the bumps 233a, 233b, 233c, 233d, and 233e are formed. The step adjustment layer 227 may be formed of, for example, photosensitive polyimide.

The step adjustment layer 227 may be formed to partially expose an edge of the adhesive layer 225 as shown in FIG. 12, but the inventive concepts are not limited thereto. In particular, the step adjustment layer 227 may be disposed in a region surrounded by the edge of the adhesive layer 225.

The connection layers 229a, 229b, 229c, 229d, and 229e may be formed on the step adjustment layer 227. The connection layers 229a, 229b, 229c, 229d, and 229e may be connected to the electrode pads of the first to fourth light emitting diodes 10a, 10b, 10c, and 10d through the openings 227a of the step adjustment layer 227.

In some forms, the connection layer 229a may be electrically connected to a second conductivity type semiconductor layer of the first light emitting diode 10a, the connection layer 229b may be electrically connected to a second conductivity type semiconductor layer of the second light emitting diode 10b, the connection layer 229c may be electrically connected to a second conductivity type semiconductor layer of the third light emitting diode 10c, and the connection layer 229d may be electrically connected to a second conductivity type semiconductor layer of the fourth light emitting diode 10d. Meanwhile, the connection layer 229e may be commonly electrically connected to first conductivity type semiconductor layers of the first to fourth light emitting diodes 10a, 10b, 10c, and 10d.

In another embodiment, the connection layer 229a may be electrically connected to a first conductivity type semiconductor layer of the first light emitting diode 10a, the connection layer 229b may be electrically connected to a first conductivity type semiconductor layer of the second light emitting diode 10b, the connection layer 229c may be electrically connected to a first conductivity type semiconductor layer of the third light emitting diode 10c, and the connection layer 229d may be electrically connected to a first conductivity type semiconductor layer of the fourth light emitting diode 10d. Meanwhile, the connection layer 229e may be commonly electrically connected to second conductivity type semiconductor layers of the first to fourth light emitting diodes 10a, 10b, 10c, and 10d. The connection layers 229a, 229b, 229c, 229d, and 229e may be formed together on the step adjustment layer 227, and may include, for example, Au.

The bumps 233a, 233b, 233c, 233d, and 233e are formed on the connection layers 229a, 229b, 229c, 229d, and 229e, respectively. For example, the first bump 233a may be electrically connected to the second conductivity type semiconductor layer of the first light emitting diode 10a through the connection layer 229a, the second bump 233b may be electrically connected to the second conductivity type semiconductor layer of the second light emitting diode 10b through the connection layer 229b, the third bump 233c may be electrically connected to the second conductivity type semiconductor layer of the third light emitting diode 10c through the connection layer 229c, and the fourth bump 233d may be electrically connected to the second conductivity type semiconductor layer of the fourth light emitting diode 10d through the connection layer 229d. Meanwhile, the fifth bump 233e may be commonly electrically connected to the first conductivity type semiconductor layers of the first to fourth light emitting diodes 10a, 10b, 10c, and 10d through the connection layer 229e. The micro LED module 200 may be mounted on a circuit board or the like by using the bumps 233a, 233b, 233c, 233d, and 233e. However, the bumps 233a, 233b, 233c, 233d, and 233e may be omitted, and in this case, the micro LED module 200 may be mounted on a circuit board by using the connection layers 229a, 229b, 229c, 229d, and 229e. The bumps 233a, 233b, 233c, 233d, and 233e may be formed of, for example, a metal and/or a metal alloy such as AuSn, SnAg, Sn, CuSn, CuN, CuAg, Sb, Ni, Zn, Mo, Co, solder, or the like.

Meanwhile, the protection layer 231 may cover side surfaces of the bumps 233a, 233b, 233c, 233d, and 233e, and may cover the step adjustment layer 227. In addition, the protection layer 231 may cover the adhesive layer 225 exposed around the step adjustment layer 227. The protection layer 231 may be formed of, for example, a photosensitive solder resist (PSR), and thus, the protection layer 231 may be patterned first through photolithography and development processes. Then the bumps 233a, 233b, 233c, 233d, and 233e may be formed. To this end, the protection layer 231 may be formed to have openings exposing the connection layers 229a, 229b, 229c, 229d, and 229e, and the bumps 233a, 233b, 233c, 233d, and 233e may be formed in the openings of the protection layer 231. The bumps 233a, 233b, 233c, 233d, and 233e may be omitted.

The protection layer 231 may be formed of a white reflective material or a light absorbing material such as black epoxy to prevent light leakage.

Figure 13:
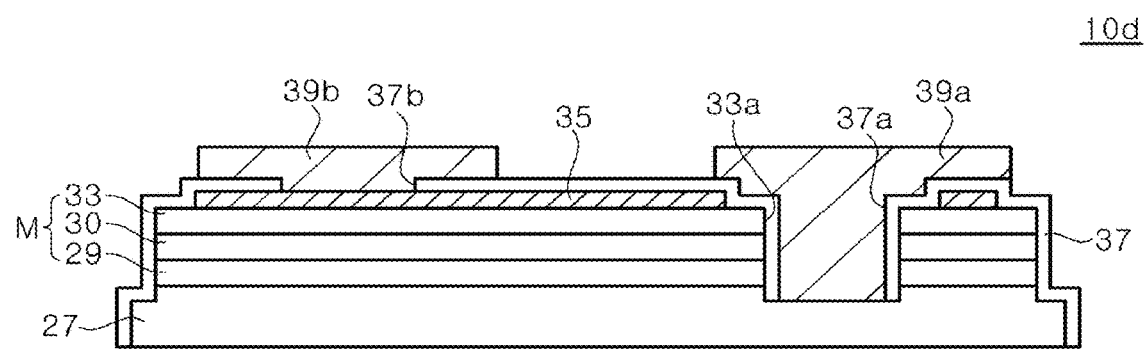
FIG. 13 is a schematic cross-sectional view illustrating a micro LED emitting white light according to an exemplary embodiment.

FIG. 13 is a schematic cross-sectional view illustrating a fourth light emitting diode 10d emitting white light according to an exemplary embodiment.

Referring to FIG. 13, the fourth light emitting diode 10d has a structure substantially similar to that of the light emitting diode 10w described with reference to FIG. 4, but the substrate 21 is omitted in the fourth light emitting diode 10d. In another exemplary embodiment, the fourth light emitting diode 10d may include the substrate 21 and thus, may have an identical structure as that of the light emitting diode 10w.

Like the light emitting diode 10w, the fourth light emitting diode 10d may change color from yellow light to white light depending on a current. In particular, in the exemplary embodiment, the fourth light emitting diode 10d may be mainly driven under a current emitting white light.

Meanwhile, the fourth light emitting diode 10d also has a micro-scale size. A light emitting area of the fourth light emitting diode 10d may be 10,000 $\mu m^2$ or less, 4,000 $\mu m^2$ or less, and further 2,500 $\mu m^2$ or less.

Since the fourth light emitting diode 10d further emits white light in addition to white light implemented by a combination of the first to third light emitting diodes 10a, 10b, and 10c, intensity of white light of a displayed image may be improved. Furthermore, the fourth light emitting diode 10d may be driven to reinforce light of a specific color generated by the combination of the first to third light emitting diodes 10a, 10b, and 10c in addition to white light. For example, when yellow light is implemented by the combination of the first to third light emitting diodes 10a, 10b, 10c, yellow light may be reinforced by driving the fourth light emitting diode 10d at a relatively low current.

The color of light emitted from the fourth light emitting diode 10d can be changed according to an applied current. Therefore, when the fourth light emitting diode 10d is applied to a micro LED display with the first to third light emitting diodes 10a, 10b, and 10c, a user can finely adjust colors of displayed images. To this end, the micro LED display apparatus may include a separate current regulator capable of adjusting the current input to the fourth light emitting diode 10d.

Figure 14:
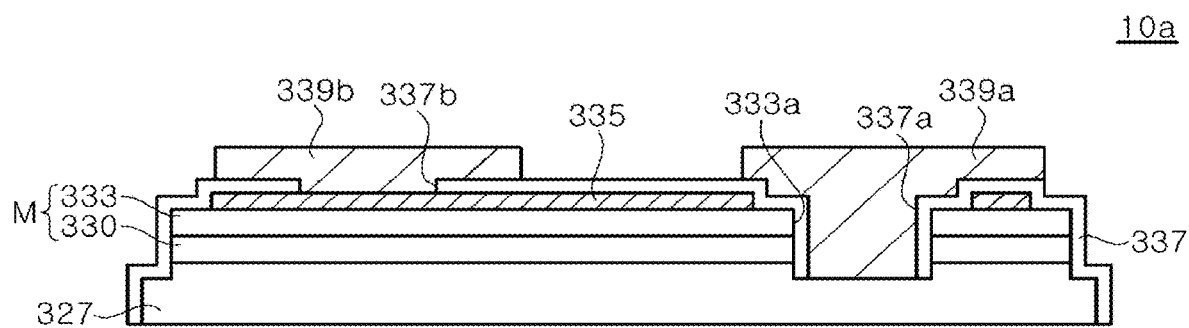
FIG. 14 is a schematic cross-sectional view illustrating a micro LED emitting monochromatic light according to an exemplary embodiment.

FIG. 14 is a schematic cross-sectional view illustrating a light emitting diode 10a emitting monochromatic light according to an exemplary embodiment. Herein, although the first light emitting diode 10a is exemplarily shown, a second and a third light emitting diodes 10b and 10c may have a similar structure.

Referring to FIG. 14, the light emitting diode 10a includes a light emitting structure including a first conductivity type semiconductor layer 327, an active layer 330, and a second conductivity type semiconductor layer 333.

The light emitting diode 10a may include an ohmic contact layer 335, an insulation layer 337, a first electrode pad 339a, and a second electrode pad 339b. The first conductivity type semiconductor layer 327, the active layer 330, and the second conductivity type semiconductor layer 333 may be grown on a substrate. The substrate may be selected according to a type of semiconductor layer to be grown, and may be one of various substrates that can be used for semiconductor growth, such as a gallium nitride substrate, a GaAs substrate, a Si substrate, a sapphire substrate, especially a patterned sapphire substrate. The growth substrate may be separated from the semiconductor layers using techniques such as mechanical polishing, laser lift off, chemical lift off, and the like. However, the inventive concepts are not limited thereto, and a portion of the substrate may remain to form at least a portion of the first conductivity type semiconductor layer 327.

Herein, the light emitting diode 10a includes semiconductor layers 327, 330, and 333 suitable for emitting red light. Meanwhile, the light emitting diode 10b includes semiconductor layers suitable for emitting green light, and the light emitting diode 10c includes semiconductor layers suitable for emitting blue light.

For example, in a case of the light emitting diode 10a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting diode 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In a case of the light emitting diode 10c emitting blue light, the semiconductor layer may include gallium nitride (GaN), indium gallium nitride (InGaN), or zinc selenide (ZnSe).

The first conductivity type and the second conductivity type have opposite polarities, such as when the first conductivity type is an n-type, the second conductivity type becomes a p-type, and, when the second conductivity type is a p-type, the second conductivity type becomes an n-type.

Although each of the first conductivity type semiconductor layer 327 and the second conductivity type semiconductor layer 333 is shown as a single layer in the drawing, these layers may be multiple layers, and may also include a superlattice layer. The active layer 330 may include a single quantum well structure or a multiple quantum well structure, and a composition ratio of a nitride-based semiconductor may be adjusted to emit a desired wavelength.

The second conductivity type semiconductor layer 333 and the active layer 330 may have a mesa M structure and may be disposed on the first conductivity type semiconductor layer 327. The mesa M may include the second conductivity type semiconductor layer 333 and the active layer 330, and may include a portion of the first conductivity type semiconductor layer 327. The mesa M may be located on a partial region of the first conductivity type semiconductor layer 327, and an upper surface of the first conductivity type semiconductor layer 327 may be exposed around the mesa M.

Meanwhile, the first conductivity type semiconductor layer 327 may have irregularities due to surface texturing. Surface texturing may be carried out, for example, by patterning using a dry etching process. For example, cone-shaped protrusions may be formed, an elevation of the cone may be about 2 μm to about 3 μm, a distance between the cones may be about 1.5 μm to about 2 μm, and a diameter of a bottom of the cone may be about 3 μm to about 5 μm. Color difference may be reduced by forming the irregularities on the surface of the first conductivity type semiconductor layer 327.

The mesa M may have a through hole 333a exposing the first conductivity type semiconductor layer 327. The through hole 333a may be disposed close to one edge of the mesa M, but the inventive concepts are not limited thereto, and may be disposed in a center of the mesa M.

The ohmic contact layer 335 is disposed on the second conductivity type semiconductor layer 333 to be in ohmic contact with the second conductivity type semiconductor layer 333. The ohmic contact layer 335 may be formed of a single layer or multiple layers, and may be formed of a transparent conductive oxide layer or a metallic layer. The transparent conductive oxide layer may include ITO, ZnO, or the like, and the metallic layer may include a metal such as Al, Ti, Cr, Ni, Au, or the like and alloys thereof.

The insulation layer 337 covers the mesa M and the ohmic contact layer 335. Furthermore, the insulation layer 337 may cover an upper and side surfaces of the first conductivity type semiconductor layer 327 exposed around the mesa M. Meanwhile, the insulation layer 337 may have an opening 337a exposing the first conductivity type semiconductor layer 327 in the through hole 333a and an opening 337b exposing the ohmic contact layer 335. The insulation layer 337 may be formed of a single layer or multiple layers of a silicon oxide layer or a silicon nitride layer. Further, the insulation layer 337 may include an insulating reflector such as a distributed Bragg reflector.

The first electrode pad 339a and the second electrode pad 339b are disposed on the insulation layer 337. The first electrode pad 339a may be electrically connected to the first conductivity type semiconductor layer 327 through the opening 337a, and the second electrode pad 339b may be electrically connected the ohmic contact layer 325 through the opening 337b.

The first and/or second electrode pads 339a and 339b may be formed of a single layer or a multilayer metal. As a material of the first and/or second electrode pads 339a and 339b, metals such as Al, Ti, Cr, Ni, Au, and alloys thereof may be used.

Although the light emitting diode 10a according to the exemplary embodiment has been briefly described with reference to the drawings, the light emitting diode 10a may further include a layer having additional functions in addition to the above-described layers. For example, various layers such as a reflective layer for reflecting light, an additional insulation layer for insulating a specific element, and a solder preventing layer for preventing diffusion of solder may be further included.

In addition, when a flip-chip type light emitting device is formed, the mesa M may be formed to have various shapes, and locations and shapes of the first and second electrode pads 339a and 339b may also be variously modified. In addition, the ohmic contact layer 325 may be omitted, and the second electrode pad 339b may directly contact the second conductivity type semiconductor layer 333. Although the first electrode pad 339a is shown as being directly connected to the first conductivity type semiconductor layer 327, a contact layer is first formed on the first conductivity type semiconductor layer 327 exposed to the through hole 333a, and the first electrode pad 339a may be connected to the contact layer.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

What is claimed is:

1. An emitting device comprising:
   a light emitting diode, the light emitting diode comprising:
   an n-type nitride semiconductor layer;
   an active layer located on the n-type nitride semiconductor layer; and
   a p-type nitride semiconductor layer located on the active layer, wherein the active layer includes a well layer formed of $In_xAl_yGa_{1-x-y}N$ (0<x<1, 0≤y<1), wherein the light emitting diode emits light that varies color coordinates as a driving current varies.

2. The emitting device of claim 1, wherein the light emitting diode emits light having two peak wavelengths as the driving current varies.

3. The emitting device of claim 1, wherein: the light emitting diode further includes a V-pit generation layer disposed between the n-type nitride semiconductor layer and the active layer, and a portion of the active layer is formed in a V-pit of the V-pit generation layer.

4. The emitting device of claim 3, wherein: the V-pit generation layer has a thickness exceeding 450 nm, and the V-pit formed in the V-pit generation layer includes a V-pit having a width of an inlet exceeding 230 nm.

5. The emitting device of claim 3, wherein: the light emitting diode further includes a p-type $Al_xGa_{1-x}N$ layer interposed between the active layer and the p-type nitride semiconductor layer, and a composition ratio x of Al in the p-type $Al_xGa_{1-x}N$ layer is greater than 0 and less than 0.1.

6. The emitting device of claim 5, wherein the p-type $Al_xGa_{1-x}N$ layer has a thickness of 100 nm or less.

7. The emitting device of claim 5, wherein: the active layer has a multi-quantum well structure having a plurality of well layers and a plurality of barrier layers, the active layer further includes one or more capping layers, each capping layer covering a well layer and interposed between the covered well layer and a barrier layer of the plurality of barrier layers, and the capping layer contains Al.

8. A display apparatus, comprising:
   a circuit board; and
   a first light emitting diode and a second light emitting diode arranged on the circuit board; and
   a cover layer covering the first light emitting diode and the second light emitting diode; wherein
   wherein each of the first light emitting diode and the second light emitting diode has an active layer formed of of $In_xAl_yGa_{1-x-y}N$ (0<x<1, 0≤y<1),
   the first light emitting diode and the second light emitting diode are configured to emit light of different colors from one another, and the second light emitting diode is configured to emit light that varies color coordinates depending on a driving current.

9. The display apparatus of claim 8, wherein the second light emitting diode emits light having two peak wavelengths.

10. The display apparatus of claim 8, wherein the second light emitting diode further comprises:
    an n-type nitride semiconductor layer located on a first side of the active layer;
    a p-type nitride semiconductor layer located on a second side of the active layer, opposite the first side; and
    a v-pit generation layer disposed between the n-type nitride semiconductor layer and the active layer, wherein a portion of the active layer is formed in a v-pit of the v-pit generation layer.

11. The display apparatus of claim 10, wherein the second light emitting diode further includes a p-type $Al_xGa_{1-x}N$ layer interposed between the active layer and the p-type nitride semiconductor layer; and a composition ratio x of Al in the p-type $Al_xGa_{1-x}N$ layer is greater than 0 and less than 0.1.

12. The display apparatus of claim 11, wherein the p-type $Al_xGa_{1-x}N$ layer has a thickness of 100 nm or less.

13. The display apparatus of claim 8, wherein: the active layer of the second light emitting diode has a multi-quantum well structure having a plurality of well layers and a plurality of barrier layers, the active layer further includes a capping layer covering the well layer between the well layer and the barrier layer, and the capping layer contains Al.

14. The display apparatus of claim 8, wherein, upon operation, the first light emitting diode is configured to emit monochromatic light, and the second light emitting diode is configured to emit white light.

15. The display apparatus of claim 14, further comprising a separate current regulator configured to adjust a current input to the second light emitting diode.

16. A lighting apparatus comprising:
   a circuit board;
   a light emitting diode arranged on the circuit board, the light emitting diode comprising:
      a n-type nitride semiconductor layer;
      an active layer located on the n-type nitride semiconductor layer; and
      a p-type nitride semiconductor layer located on the active layer,
      wherein the active layer has a well layer formed of $In_xAl_yGa_{1-x-y}N$ ($0<x<1$, $0\leq y<1$), and
      wherein the light emitting diode emits light that varies color coordinates as a driving current varies.

17. The lighting apparatus of claim 16, wherein the light emitting diode emits light having two peak wavelengths as the driving current varies.

18. The lighting apparatus of claim 16, wherein: the light emitting diode further includes a V-pit generation layer disposed between the n-type nitride semiconductor layer and the active layer, and a portion of the active layer is formed in a V-pit of the V-pit generation layer.

19. The lighting apparatus of claim 16, further comprising:
   a second light emitting diode arranged on the circuit board; and
   a cover layer covering the first light emitting diode and the second light emitting diode.

20. The lighting apparatus of claim 16, wherein: the well layer is included in a multi-quantum well structure having a plurality of well layers and a plurality of barrier layers, the active layer further includes one or more capping layers, each capping layer covering a well layer of the plurality of well layers and interposed between the covered well layer and a barrier layer of the plurality of barrier layers, and the capping layer contains Al.

* * * * *